(12) United States Patent
Ebinuma et al.

(10) Patent No.: US 7,113,263 B2
(45) Date of Patent: *Sep. 26, 2006

(54) SUPPORTING STRUCTURE OF OPTICAL ELEMENT, EXPOSURE APPARATUS HAVING THE SAME, AND MANUFACTURING METHOD OF SEMICONDUCTOR DEVICE

(75) Inventors: Ryuichi Ebinuma, Tokyo (JP); Yuji Sudo, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/950,420

(22) Filed: Sep. 28, 2004

(65) Prior Publication Data

US 2005/0046815 A1    Mar. 3, 2005

Related U.S. Application Data

(62) Division of application No. 09/817,018, filed on Mar. 27, 2001, now Pat. No. 6,867,848.

(30) Foreign Application Priority Data

Mar. 30, 2000   (JP)   ............... 2000-094936
Mar. 21, 2001   (JP)   ............... 2001-080798

(51) Int. Cl.
*G03B 27/62* (2006.01)
*G03B 27/42* (2006.01)
*G02B 7/02* (2006.01)

(52) U.S. Cl. ............... 355/75; 355/53; 359/820

(58) Field of Classification Search ............ 355/30, 355/53, 72–76; 359/811–820, 620, 826

See application file for complete search history.

(56) References Cited

U.S. PATENT DOCUMENTS

| | | | | |
|---|---|---|---|---|
| 4,723,833 A | | 2/1988 | Yamada | 350/252 |
| 4,733,945 A | | 3/1988 | Bacich | 350/253 |
| 5,128,975 A | | 7/1992 | Iwamoto et al. | 378/34 |
| 5,262,900 A | * | 11/1993 | Gerber | 359/811 |
| 5,488,514 A | | 1/1996 | Bruning et al. | 359/811 |
| 5,800,949 A | | 9/1998 | Edo et al. | 430/5 |
| 5,822,133 A | | 10/1998 | Mizuno et al. | 359/696 |
| 5,822,389 A | | 10/1998 | Uzawa et al. | 378/34 |
| 5,933,215 A | | 8/1999 | Inoue et al. | 355/53 |
| 6,040,950 A | * | 3/2000 | Broome | 359/820 |
| 6,043,863 A | | 3/2000 | Ikeda | 355/53 |
| 6,108,145 A | | 8/2000 | McCrary | 359/820 |
| 6,118,599 A | * | 9/2000 | Spinali | 359/820 |
| 6,220,647 B1 | | 4/2001 | Rea | 296/220.01 |
| 6,295,118 B1 | | 9/2001 | Takeuchi | 355/52 |
| 6,388,823 B1 | | 5/2002 | Gaber et al. | 359/819 |
| 6,480,460 B1 | * | 11/2002 | Ohkuma et al. | 369/246 |

FOREIGN PATENT DOCUMENTS

| | | |
|---|---|---|
| JP | 11-44834 | 2/1999 |
| JP | 11-149029 | 6/1999 |
| JP | 11-231192 | 8/1999 |
| JP | 2000-66067 | 3/2000 |
| JP | 2001-242364 | 9/2001 |

* cited by examiner

*Primary Examiner*—Henry Hung Nguyen
(74) *Attorney, Agent, or Firm*—Fitzpatrick, Cella, Harper & Scinto

(57) ABSTRACT

A supporting structure for supporting an optical element includes a first supporting member for supporting the optical element, and a second supporting member for supporting the first supporting member. The value of a thermal expansion coefficient of the first supporting member is between those of the optical element and the second supporting member.

6 Claims, 11 Drawing Sheets

SUPPORTING STRUCTURE OF OPTICAL ELEMENT, EXPOSURE APPARATUS HAVING THE SAME, AND MANUFACTURING METHOD OF SEMICONDUCTOR DEVICE

This is a divisional application of U.S. patent application Ser. No. 09/817,018, filed Mar. 27, 2001, now U.S. Pat. No. 6,867,848.

BACKGROUND OF THE INVENTION

1. Field of the Invention

The present invention relates to a supporting structure of optical elements, an optical apparatus such as an exposure apparatus constructed by using the supporting structure, and a method for manufacturing a semiconductor device by using the optical apparatus, etc., and in particular relates to a supporting member for supporting an optical element such as a lens and a mirror, and an optical apparatus with a high degree of accuracy which comprises the supporting member for supporting the optical element, the optical apparatus being an exposure apparatus for use in manufacturing semiconductor integrated circuits, for example.

2. Description of the Related Art

A semiconductor exposure apparatus is an apparatus for transferring a negative plate (reticle) having a circuit pattern onto a substrate (silicon wafer). During the transferring, a projection lens is used for forming an image of the reticle pattern on the wafer, and high resolution of the projection lens is required for forming a highly integrated circuit. Accordingly, the lens for the semiconductor exposure apparatus is supported to have small aberration.

In view of such conditions, lenses for the semiconductor exposure apparatus demand uniformity in various characteristics of glass and films and high processing accuracy of a glass figure and assembling accuracy.

A lens barrel for holding glass used for lenses is generally made from a metal and materials different from glass are used therefor.

FIG. 11 illustrates part of an optical system of a conventional semiconductor exposure apparatus and shows a structural concept of the lens barrel. In the drawing, plural lenses 101 and 102 are fixed to metallic frames 103 and 104 for holding the lenses, which are further placed within a supporting member 105 and are urged and fixed thereto from upward movement by retaining screw-rings 107 and 108, respectively.

However, in the structure of the conventional lens barrel mentioned above, upon changing of ambient temperature, since the lenses and lens barrel elements respectively change in shape, the aberration thereof may change. In an exposure apparatus especially using a light source with a short wavelength, lenses are made from quartz or fluorite; since materials of the lenses and the lens barrel elements differ in the thermal expansion coefficient from each other, they cannot expand or shrink simply and freely without restriction from outside, respectively; consequently, the lens figure largely changes, thereby such deformation due to temperature changes largely affects the aberration of the lenses. Plural supporting members 105 are generally overlaid one on another to be arranged in the axial direction; when an external force is applied thereto during the connection thereof by overlaying or due to other reasons, the metallic frame for holding the lens is pressurized so that the lens is subjected to an external force from the screw-rings, etc., thereby deforming the lens figure, resulting in degraded performance of the optical system.

Also, in the conventional example mentioned above, the lens placed within the inner radius of the metallic frame becomes deformed due to gravity; by reasons that the direction and amount of such deformation depend on the figure of a lens placing portion and it is difficult to process the planar figure of the lens placing portion with a higher accuracy than that of the lens, and it cannot be assumed in advance that how the lens abutting the lens placing portion becomes deformed because each workpiece of the portion differs from one another, it is necessary that various kinds of aberration be corrected by predetermined adjustment of the lens posture or positions after checking the optical performance in the assembled optical system, which requires high accuracy in the deformation, resulting in an increased number of steps for assembly and adjustment.

In order to solve such problems, Japanese Patent Laid-Open No. 2000-66075 discloses that a lens is supported at plural points and the rotational angle of an optical element is adjusted so as to reduce the aberration of the entire optical system, which results from each optical element deformation produced by the lens support. However, in this structure, it is known that upon changes in ambient temperature, the lens surface is deformed due to the thermal expansion coefficient difference between the lens and the metallic frame (when the lens is supported with three-point supporting, the 3θ deformation sensitively changes relative to the temperature), so that the desired optical performance cannot be obtained.

SUMMARY OF THE INVENTION

Accordingly, it is an object of the present invention to provide, by solving the conventional problems described above, a supporting structure of optical elements, which can reduce the lens surface deformation due to the strain produced by changes in ambient temperature and during the assembling so as to obtain a stable high resolution with small aberration, an optical apparatus such as an exposure apparatus constructed by using the supporting structure, and a manufacturing method of a semiconductor device, etc., using the apparatus.

In accordance with a first aspect of the present invention, there is provided a supporting structure for supporting an optical element comprising: a first supporting member for supporting the optical element; a second supporting member arranged in the outer diameter side of the first supporting member for supporting the first supporting member; and an elastic member placed between the first supporting member and the second supporting member in the radial direction, the inner diameter side of the elastic member being connected to the first supporting member while the outer diameter side of the elastic member being connected to the second supporting member, the elastic member being elastically deformable in the radial direction, wherein the first supporting member does not contact the second supporting member in the axial direction.

In accordance with a second aspect of the present invention, there is provided an exposure apparatus comprising: an illuminating optical system for illuminating a reticle with a light beam from a light source; and a projection optical system for projecting a light beam from the reticle on a wafer, wherein the illuminating optical system and/or the projection optical system have a supporting structure for supporting an optical element according to the first aspect of the present invention.

In accordance with a third aspect of the present invention, there is provided a method for manufacturing semiconductor devices comprising an exposing step performed by an exposure apparatus according to the second aspect of the present invention.

In accordance with a fourth aspect of the present invention, there is provided a supporting structure for supporting an optical element comprising: an optical element; a first supporting member for supporting the optical element; and a second supporting member for supporting the first supporting member, the second supporting member being made from a material different from that of the first supporting member, wherein the thermal expansion difference between the optical element and the first supporting member is smaller than the thermal expansion difference between the optical element and the second supporting member.

In accordance with a fifth aspect of the present invention, there is provided a supporting structure for supporting an optical element comprising: an optical element made from fluorite; a first supporting member for supporting the optical element; and a second supporting member made from a material different from that of the first supporting member, wherein the thermal expansion difference between the optical element and the first supporting member is within ±10%.

In accordance with a sixth aspect of the present invention, there is provided a supporting structure for supporting an optical element comprising: a plurality of optical elements; a plurality of first supporting members for respectively supporting the plurality of optical elements; and a plurality of second supporting members for respectively supporting the plurality of first supporting members via structures having elasticity in the radial direction of the optical element.

Further objects, features and advantages of the present invention will become apparent from the following description of the preferred embodiments with reference to the attached drawings.

DESCRIPTION OF THE PREFERRED EMBODIMENTS

An embodiment of the present invention, which discloses a supporting structure of optical elements, an optical apparatus such as an exposure apparatus constructed by using the supporting structure, and a manufacturing method of manufacturing a semiconductor device, etc., using the apparatus, can reduce the unnecessary lens surface deformation due to the strain produced by changes in ambient temperature and during the assembling so as to obtain stable, high resolution with small aberration by virtue of the above-mentioned structure. For example, use of the above-mentioned structure reduces the deformation produced in an optical element by the thermal strain due to ambient temperature changes in the optical apparatus and a temperature increase in the optical element by light energy absorption. Using the structure also reduces the difference in the thermal expansion coefficient so as to decrease the thermal deformation of the optical element. Furthermore, using the structure reduces the stress produced when an elastic portion absorbs the thermal deformation difference between a first supporting member and a second supporting member, thereby improving the efficiency in absorbing the deformation. Since, by using the structure, an eccentricity of the optical element is prevented or the unnecessary thermal deformation affecting the optical element can be symmetrized about the axis even though it is very small, the inverse effect affecting the optical performance can be effectively reduced. Also, by using the structure, an optical apparatus or manufacturing apparatus for manufacturing semiconductors, etc., can be achieved so as to have stable, high resolution with small aberration.

EMBODIMENT

Embodiments according to the present invention will be described below.

(First Embodiment)

Figure 1:
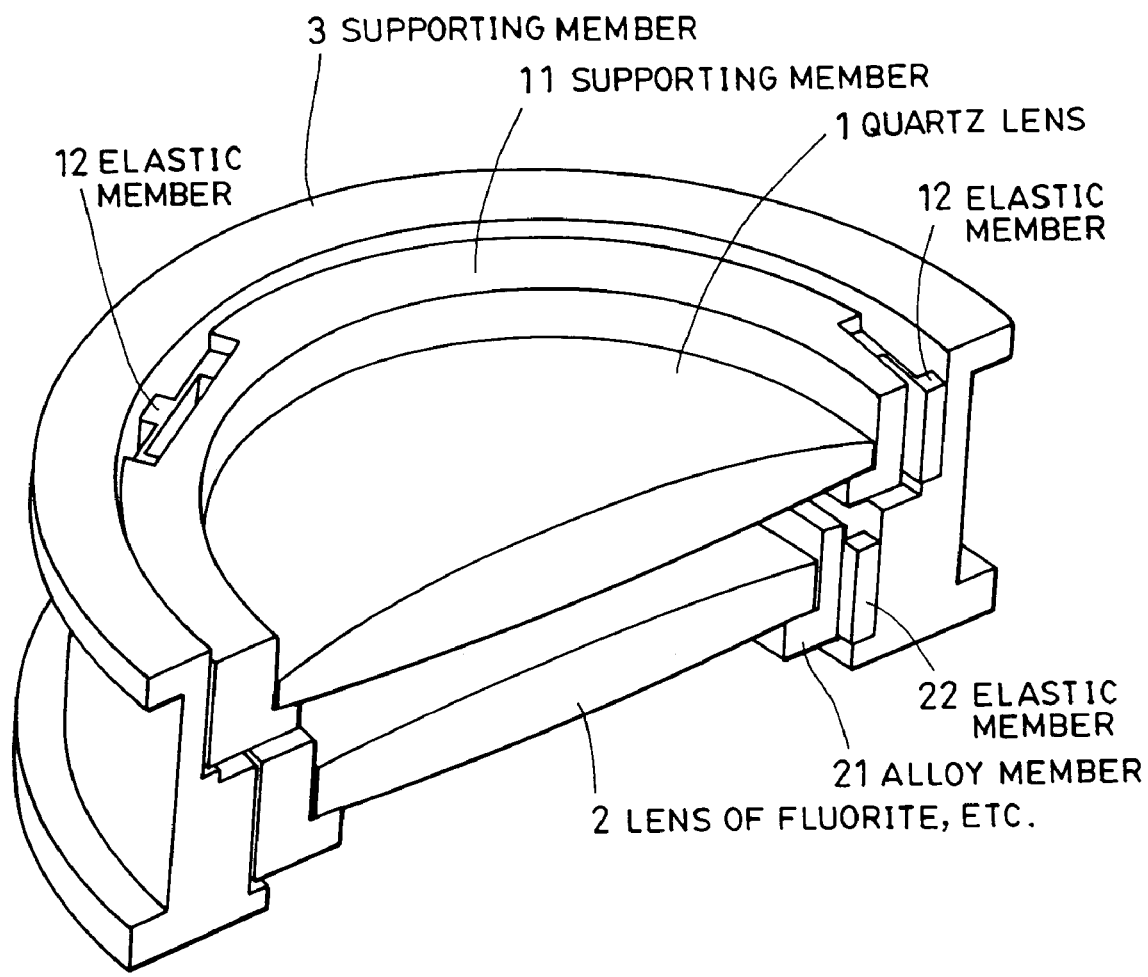
FIG. 1 is a drawing of a structure of a lens supporting member according to a first embodiment of the present invention.

In a first embodiment, a supporting member of a lens is formed by using the above-mentioned structure, and FIG. 1 shows a half of optical elements according to the embodiment.

The drawing shows a quartz lens 1 and the lens supporting member 11 made from invar, which is a nickel alloy having a thermal expansion coefficient substantially identical to that of quartz. In addition, the lens 1 is fixed to the supporting member 11 by adhesion.

A supporting member 3 coaxially supports lenses and is made from iron.

In the peripheral portions of the supporting member 11, plural cut-outs are formed so as to arrange elastic member 12 therein, which are leaf springs. In the elastic member 1, both plate ends are connected to the supporting member 11 while the center thereof is connected to the supporting member 3. By this supporting structure, the elastic member 12 has small elasticity relative to the optical elements in the radial direction.

The drawing also shows a fluorite lens 2 and a supporting member 21 for supporting the lens 2, which is brass, a copper-zinc alloy having substantially the same thermal expansion coefficient as that of fluorite.

The lens 2 is also bonded to the supporting member 21. An elastic member 22 is identical with the elastic member 12.

Figure 2:
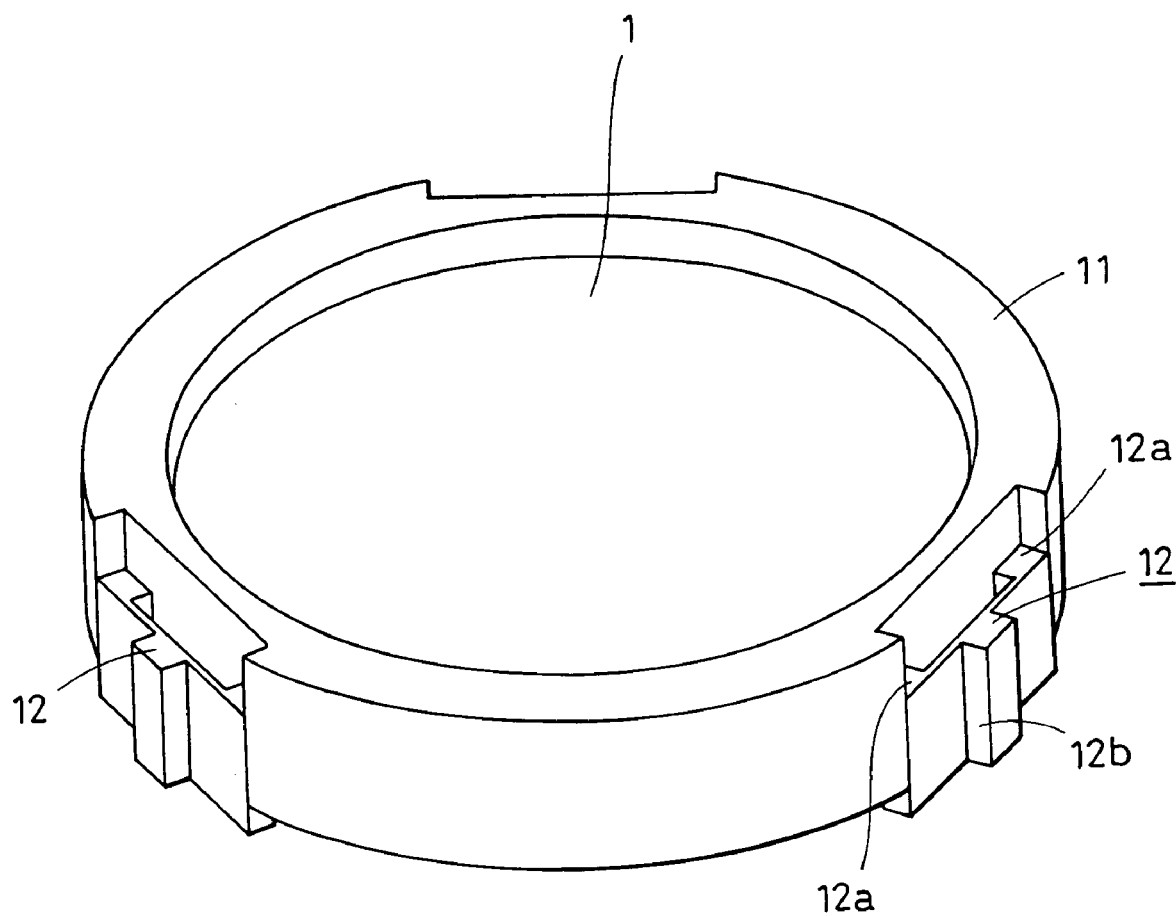
FIG. 2 is a drawing of part of the structure of the lens supporting member according to the first embodiment of the present invention.

FIG. 2 shows part of the lens supporting members shown in FIG. 1 and positions in one lens unit, in which the elastic members are attached. As shown in the drawing, plural elastic members 12 are arranged at substantially the same angular pitches in the periphery of the supporting member 11 and both ends 12a thereof in the inner diameter side of the supporting member 11 are connected to the supporting member 11 with screws. The elastic member 12 is connected to the supporting member 3 with screws at the central position 12b in the outer diameter side of the supporting member 11. The supporting member 11 does not contact the supporting member 3 in the axial direction, so that the weight of the supporting member 11 is supported by the elastic members 12.

The material of the elastic member 12 is preferably identical to that of the supporting member 11; however, it may be another material such as a metallic material for springs such as stainless steel and a non-metallic material such as zirconium. This is because when the rigidity of the supporting member 11 is much higher than that of the elastic member 12, the thermal strain due to the thermal expansion coefficient difference between both the materials does not have a serious influence on the entire system. Similarly, the material of the elastic member 22 is preferably identical to that of the supporting member 21; however, it may be another material. FIG. 2 illustrates the case that three elastic members are arranged; the number of elastic members is preferably three; however, it is not limited to this; it may be two or more. In any case, in circumferences of the supporting members 11 and 21, the elastic members 12 and 22 are respectively arranged at equal intervals so that the eccentricity of the supporting members 11 and 21 due to the thermal strain can be prevented.

In a lens barrel of such a structure, upon changes in ambient temperature, the supporting members 3 and 11 expand or shrink differently from each other due to the thermal expansion coefficient difference between both the materials; however, the bending deformation of the plate-shaped spring portion of the elastic member 12 absorbs the thermal expansion difference, so that the supporting member 11 can simply expand or shrink substantially freely.

The thermal expansion coefficients of the quartz lens 1 and the fluorite lens 2 are substantially the same as those of the surrounding supporting members 11 and 21, respectively, so that the lenses can substantially simply expand or shrink, thereby suppressing the surface figure strain which is destructive to the optical performance.

The tolerance of the difference between the thermal expansion coefficient of the lens and that of the surrounding supporting member depends on accuracies in ambient temperature of the optical system and the optical performance required for the optical system.

The optimum materials of the supporting member may be selected in consideration of these conditions. For example, if these conditions permit, alumina, ceramic iron may be selected as the material of the supporting member 11 for the quartz lens, even though these materials have a thermal expansion coefficient being slightly different from quartz. In any case, a material having a thermal expansion coefficient being closer to that of the lens than that of the supporting member 3 may be used for the supporting members 11 and 21, and thereby reducing harmful deformation of the lens surface figure due to temperature changes of the lens and increasing the temperature stability of the optical system. The supporting members 11 and 21 also do not directly contact the supporting member 3 in axial and radial directions and both the supporting members 11 and 21 are supported via the elastic members 12 and 22, respectively. This means that an external force to the supporting member 3 or the deformation thereof due to the weight is not directly transmitted to the supporting members 11 and 21 so as to suppress the surface figure strains of the lenses 1 and 2 due to the deformation of the supporting members 11 and 21.

(Second Embodiment)

Figure 3:
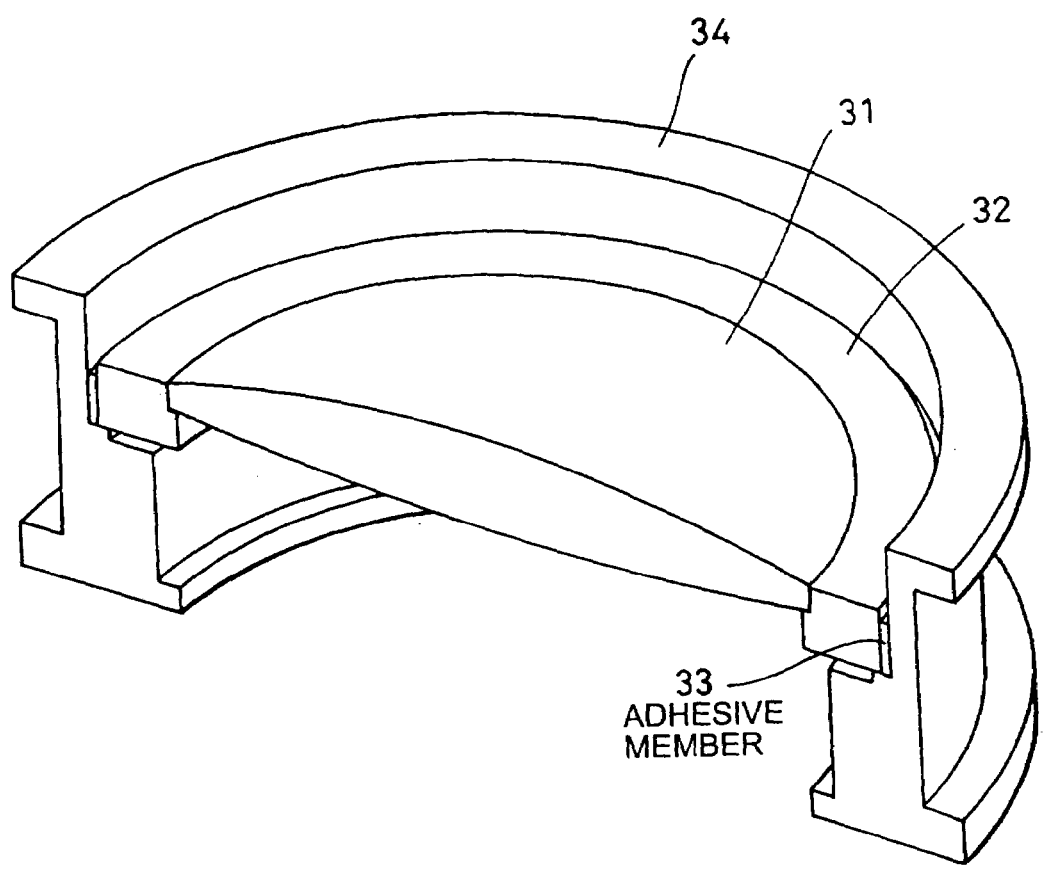
FIG. 3 is a drawing of a structure of a lens supporting member according to a second embodiment of the present invention.

FIG. 3 illustrates the structure of a lens supporting member according to a second embodiment of the present invention.

The drawing shows a quartz lens 31, a lens supporting member 32 made from invar, a rubber adhesive member 33 having elasticity, and a member 34 for supporting the lens supporting member 32, which is made from iron. In the embodiment, just like the first embodiment, the thermal expansion coefficient of the supporting member 32 is also to be close to that of the lens 31 and the unnecessary thermal deformation due to the thermal expansion coefficient difference between the supporting members 34 and 32 can be relieved by the elasticity of the adhesive 33, enabling the harmful deformation of the lens surface figure to be reduced.

(Third Embodiment)

Figure 4:
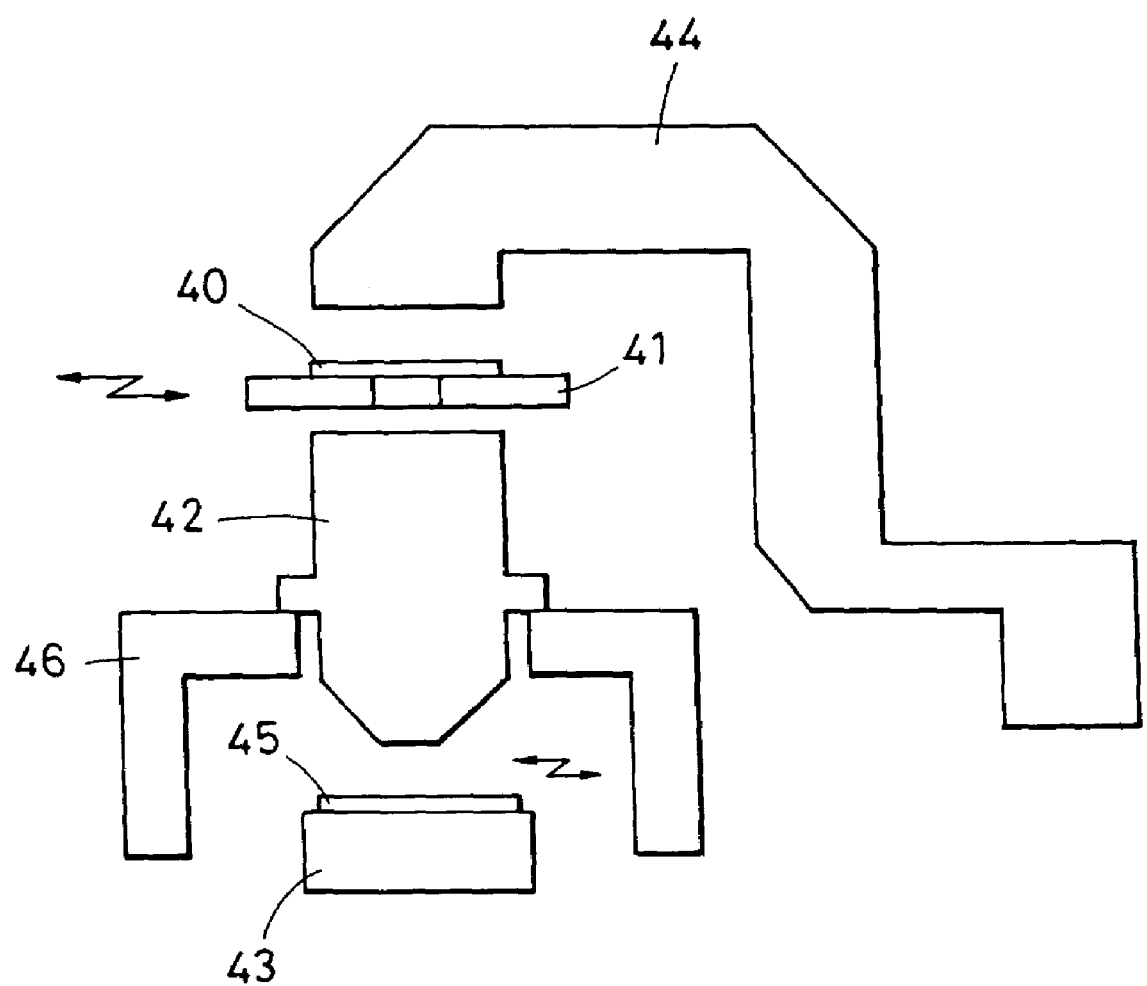
FIG. 4 is a drawing of a structure of an exposure apparatus for semiconductors according to a third embodiment of the present invention.

FIG. 4 is a schematic diagram of an exposure apparatus, in which the lens supporting member shown in FIG. 1 or 3 is applied to a semiconductor exposure apparatus.

In the exposure apparatus, part of a reticle 40 placed on a reticle stage 41 is irradiated with an illuminating light beam for exposure from an illuminating optical system 44. The illuminating light beam is an excimer laser beam having a wavelength of 193 nm.

The irradiated region is slit-like and covering part of a pattern region of the reticle. The pattern corresponding to the slit-like portion is reduced in scale to be a quarter by a projection optical system 42 so as to be projected on a wafer 45 placed on a wafer stage 43. The projection optical system 42 is arranged on a frame 46 of the exposure apparatus.

By scanning the reticle and the wafer relative to the projection optical system, the pattern region of the reticle is transferred on sensitive materials on the wafer. This scanning exposure is repeatedly performed on plural transfer regions (shots).

The projection optical system 42 is required to have high resolution and the supporting member for the lens thereof is demanded to have a structure with high accuracies. Quartz and fluorite are used for the material of the lens.

These lenses are supported as shown in FIG. 1, and in FIG. 1, when numerals 1 and 2 respectively denote the quartz lens and the fluorite lens, it is preferable that an alloy member 11 is made from invar which is an alloy of iron and nickel as principal ingredients, and an alloy member 21 is made from an alloy of copper and zinc as principal ingredients such as brass.

Both the members preferably have thermal expansion coefficients being substantially identical to those of the lenses to be supported.

A material of the supporting member 11 for supporting the quartz lens 1 may be preferably selected from a cordierite material including magnesium oxide and silicon oxide, a ceramic material including alumina and silicon nitride, and a glass material having low thermal expansion which is called Zerojule as the trade name.

A material of the member 21 for supporting the fluorite lens 2 may be preferably selected from an alloy of iron-chromium-nickel such as so-called 18-8 stainless steel, an alloy of copper-tin-phosphorus, which is called copper or phosphor bronze, an alloy of nickel-iron-manganese-copper, which is called copper or white copper, an alloy of nickel-chromium, and an alloy including aluminum as a principal ingredient such as an aluminum die-casting alloy of aluminum-silicon-copper. When being applied especially to the exposure apparatus, since the energy of a light beam for exposure is absorbed by the lens so as to generate heat, a copper alloy having a high thermal conductivity is more preferable. The thermal expansion coefficient of fluorite is approximately 19 ppm; by simulation, the inventor confirmed that by using materials having the same coefficient as this value with errors within ±10%, harmful effects due to temperature on the lens can be substantially suppressed.

As a material of the supporting member 3, a material having any thermal expansion coefficient from iron down may be used. By the elastic members 12 and 22, the unnecessary deformation of the lens due to the thermal expansion coefficient difference between materials being different from each other can be reduced. When the entire lens system is fixed to the frame 46 of the exposure apparatus body, the strain due to the fixing may be produced in the lens supporting member 3; however, the elastic members 12 and 22 have a function of reducing the strain from affecting the lens. Therefore, the lens supporting structure with high accuracies can be obtained, so that a lens system for obtaining resolution required for manufacturing semiconductors can be achieved.

An important thing in the lens supporting structure for use in the exposure apparatus is that the lens itself produces heat in it due to a laser beam for exposure. During the expansion of the lens due to the heat, when the thermal expansion coefficients of the supporting members 11 and 21 are substantially the same as those of the lenses, the expansions of the supporting members 11 and 21 by the thermal conduction to the supporting members are substantially the same as those of the lenses, thereby largely suppressing the harmful strain of the lens.

(Fourth Embodiment)

Figure 5:
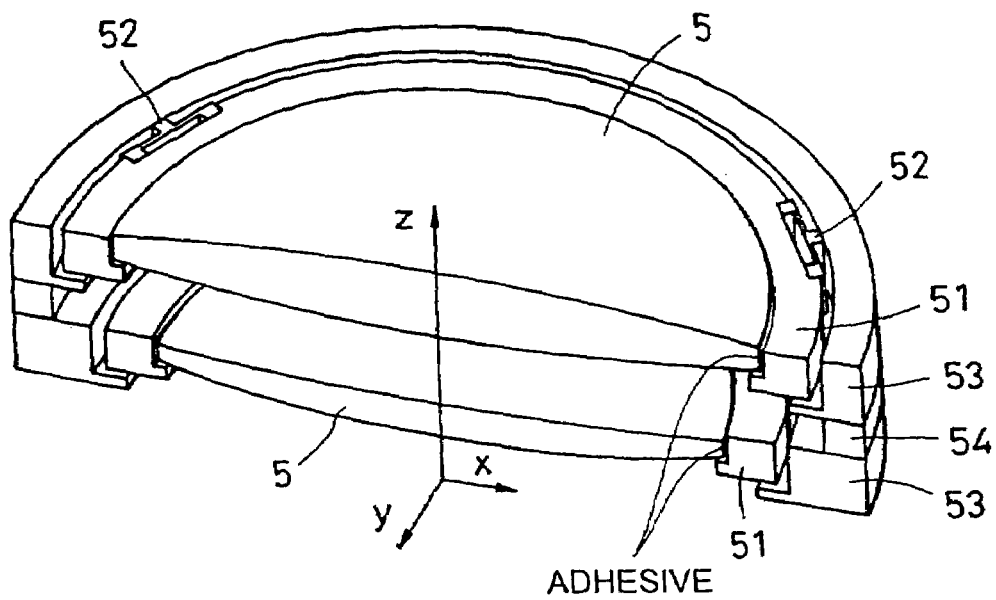
FIG. 5 is a drawing of a structure of a lens supporting member according to a fourth embodiment of the present invention.

A fourth embodiment of the present invention will be described with reference to FIGS. 5 to 7. FIG. 5 shows a half of an optical apparatus according to the embodiment. The direction of gravity agrees with the optical axis and is indicated by −Z in the drawing.

FIG. 5 shows a quartz lens 5 and a supporting member 51 for supporting the lens 5 and having three projections at 120° pitches for supporting peripheral portions of the lens in the gravity direction. The material of the supporting member 51 is brass in the embodiment. The radial clearance between the periphery of the lens 5 and the supporting member 51 is filled with adhesive along the whole circumference, so that the lens 5 is fixed to the supporting member 51. The supporting member 53 coaxially supports these lenses and is made from iron. Plural cut-outs are formed in the periphery of the supporting member 51 so as to arrange elastic members 52 formed by plate springs therein. In the elastic member 52, both ends of the plate are connected to the supporting member 51 and the central portion thereof is connected to the supporting member 53. By this supporting structure, the elastic member 52 has small elasticity relative to the optical elements in the radial direction.

A spacer 54 is a member for adjusting the spacing between lens barrel units at predetermined intervals in the optical axial direction, each unit comprising one lens 5, one supporting member 51, one supporting member 53, and one elastic member 52. As shown in FIG. 7, on the outer peripheries of the supporting member 53 and the spacer 54, holes and tapped holes for fixing with bolts are respectively formed at 60° pitches, so that each lens barrel unit can be arbitrarily rotated at 60° pitches so as to be relatively combined and fixed while each lens barrel unit can be moved and fixed in the direction orthogonal to the optical axis by the clearance between the hole for fixing with a bolt and the bolt so as to adjust the unit to desired optical characteristics. The holes for fixing with bolts are not limited to be at 60° pitches of course; they may be at 30° pitches, 45° pitches, or other degree pitches. Also, by using a structure different from that in the embodiment, which is movable by the clearance between the hole for fixing with a bolt and the bolt, the lens barrel unit may be moved in the direction orthogonal to the optical axis.

Since each lens 5 is supported by the supporting member 51 at three points, gravity deformation of 3θ is produced therein in the gravity direction; the lens barrel unit is rotated about the optical axis at a predetermined angle so as to be fixed so that the aberration produced in each lens by the gravity deformation is cancelled from the entire optical system so as to have desired optical performance. In this embodiment, each lens barrel unit is fixed by relatively shifting it by 60°.

Figure 6:
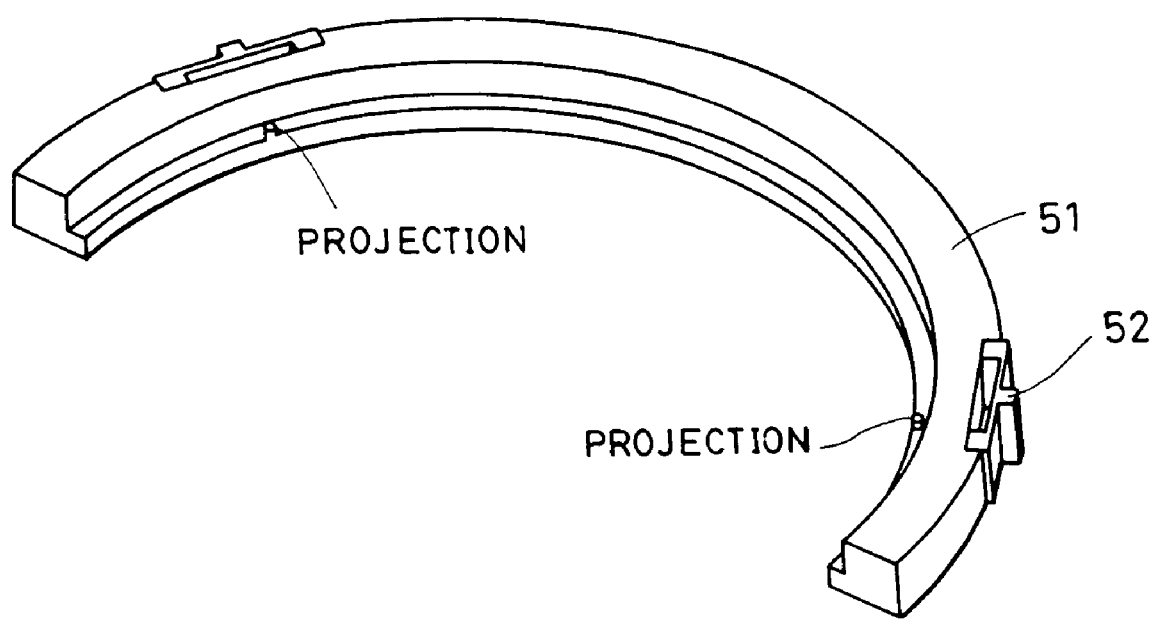
FIG. 6 is a drawing of part of the structure of the lens supporting member according to the fourth embodiment of the present invention.
Figure 7:
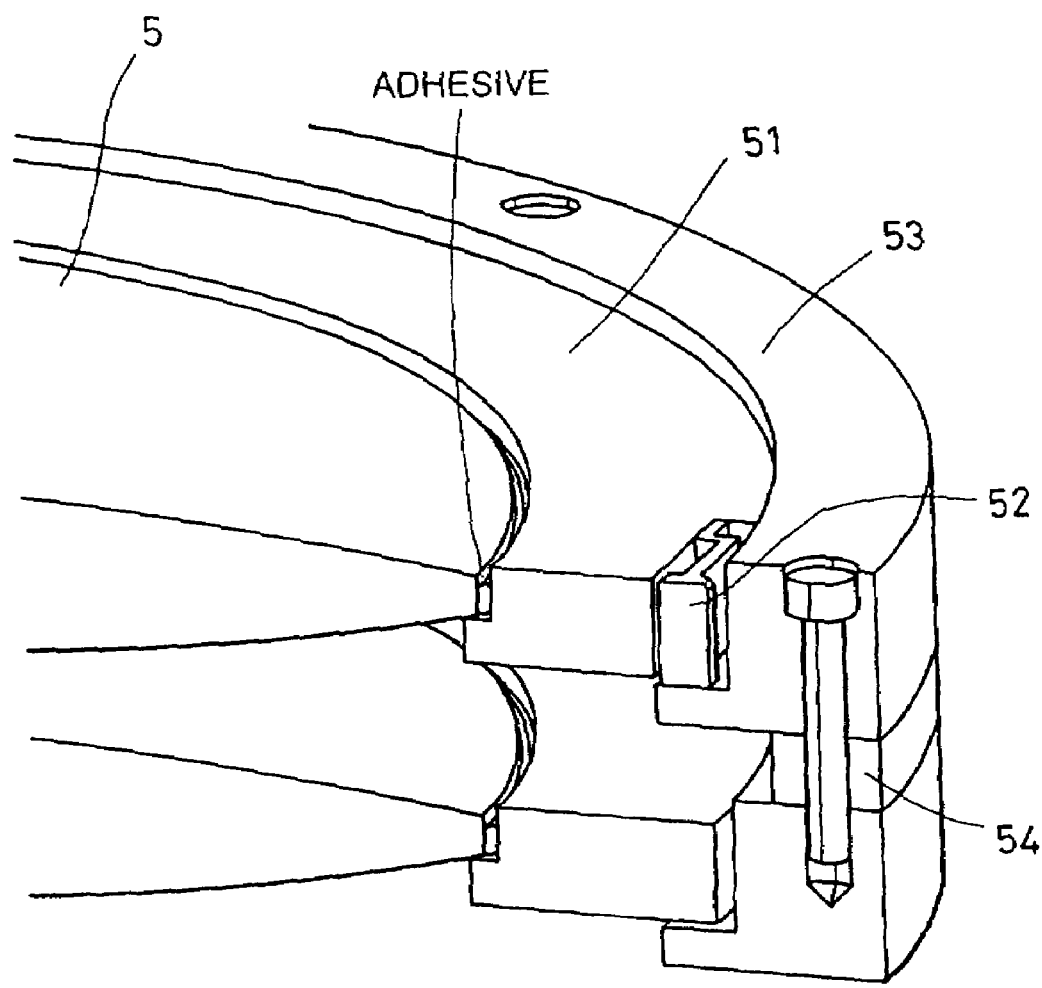
FIG. 7 is a detail view showing part of the connection portion of a second supporting member according to the fourth embodiment of the present invention.

FIG. 6 illustrates the arrangement of three elastic members; the number of the elastic members is preferably three; it is not limited to this and it may be two or more. In any case, by arranging the elastic members 52 in the periphery of the supporting member 51 at equal intervals, the eccentricity of the supporting member 51 due to the thermal strain can be prevented.

In a lens barrel of such a structure, upon changes in ambient temperature, the supporting members 53 and 51 expand or shrink differently from each other due to the thermal expansion coefficient difference between both the materials; however, the bending deformation of the plate-shaped spring portion of the elastic member 52 absorbs the thermal expansion difference, so that the supporting member 51 can simply expand or shrink substantially freely.

Between the quartz lens 5 and the supporting member 51, there is not an interposed elastic member for absorbing the thermal expansion difference, so that upon changes in ambient temperature, expansion or shrinkage is produced therein differently from each other so as to deform the lens figure; however, since the clearance between them is uniformly filled with adhesive along the whole circumference of the lens, it was confirmed by computation and experiments that the deformation is limited to being very small and being symmetrical about the axis, and the 3θ figure is not changed.

Using such a structure can reduce harmful deformation of the lens surface figure due to temperature changes of the lens and can improve the stability of the optical system against temperature changes.

Each lens can be independently rotated and combined about the optical axis at a desired angle corresponding to the lens surface figure produced by the lens gravity deformation and the lens polishing process, and further the eccentricity can be adjusted in a direction orthogonal to the optical axis, enabling the aberration of the optical system to have a desired degree.

(Fifth Embodiment)

Another embodiment of the present invention will be described below with reference to FIG. 8.

Figure 8:
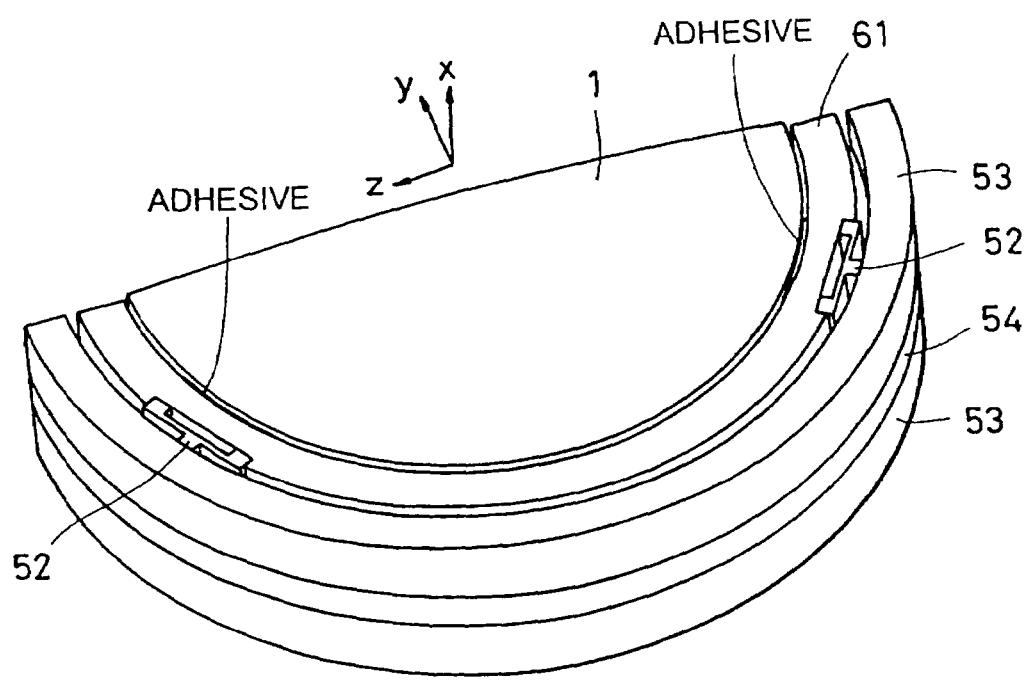
FIG. 8 is a drawing of a structure of a lens supporting member according to a fifth embodiment of the present invention.

FIG. 8 is a schematic diagram of a structure of a projection optical system according to the embodiment of the present invention.

In FIG. 8, like reference characters designate like functional portions common to the embodiments described above.

The direction of gravity agrees with the optical axis and is indicated by −Z in the drawing.

In FIG. 8, a supporting member 61 for supporting the lens 5 has three projections formed at 120° pitches for supporting the lens periphery in the gravity direction and is made from invar which is a nickel alloy having a thermal expansion coefficient being substantially identical with that of quartz. The radial clearance between the lens periphery and the supporting member 61 is filled with adhesive in the vicinities of the three projections, so that the lens is fixed to the supporting member. The coated area of the adhesive is determined by the mass of the lens so as not to move the lens 5 in position when a predetermined acceleration is applied to the optical system.

Since each lens 5 is supported by the supporting member 51 at three points, gravity deformation of the 3θ is produced therein in the gravity direction, then, the lens barrel unit is rotated about the optical axis at a predetermined angle so as to be fixed so that the aberration produced in each lens by the gravity deformation is cancelled from the entire optical system so as to have a desired optical performance. In this embodiment, each lens barrel unit is fixed by relatively shifting it by 60°.

In a lens barrel of such a structure, just like in the first embodiment, upon changes in ambient temperature, the bending deformation of the plate-shaped spring portion of the elastic member 52 absorbs the thermal expansion difference between the supporting members 61 and 53, so that the supporting member 61 can simply expand or shrink substantially freely.

In the embodiment, the quartz lens 5 is substantially the same in the thermal expansion coefficient as the surrounding supporting member 61, so that the lens can substantially simply expand or shrink, thereby suppressing the production of the surface figure strain which is destructive to the optical performance.

Also, the adhesive is used for joining the lens 5 to the supporting member 61 in the embodiment; however, by mechanically pressing the lens periphery, similar benefits may also be obtained when using the structure.

According to the embodiment, since the amount of the adhesive to be used is reduced to the utmost as described above, harmful gas produced from the adhesive which will cause the degradation in the optical performance can be suppressed to the minimum, thereby improving not only the stability of the optical system against the temperature changes but also the long term stability thereof.

(Sixth Embodiment)

Another embodiment of the present invention will be described below with reference to FIG. 9.

Figure 9:
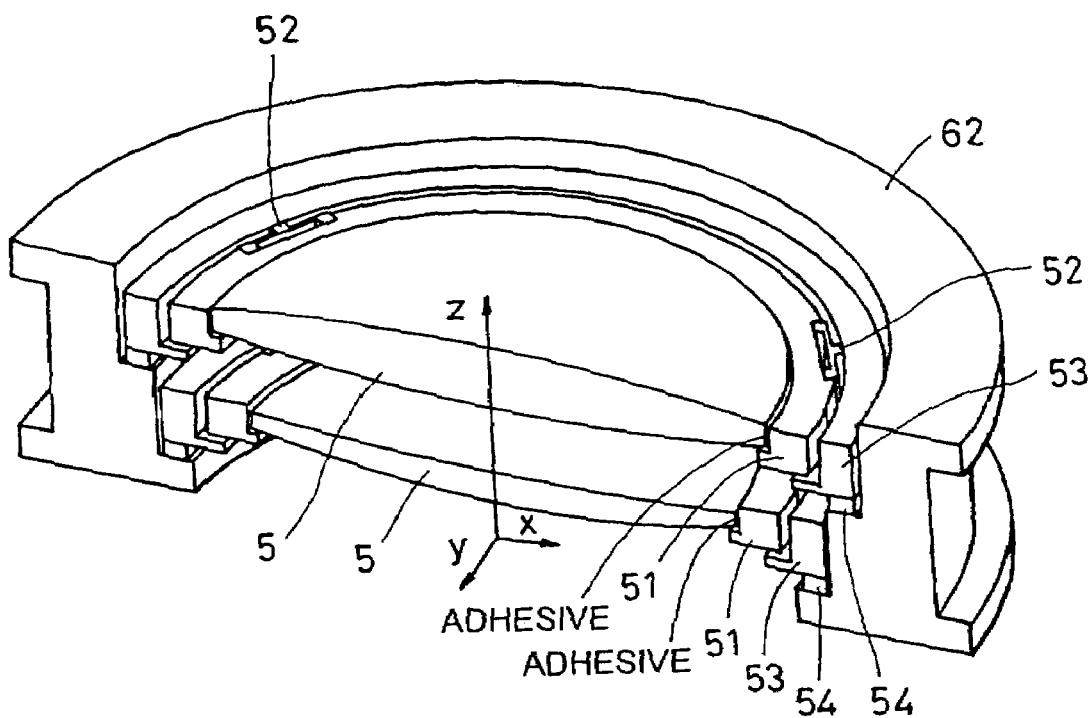
FIG. 9 is a drawing of a structure of a lens supporting member according to a sixth embodiment of the present invention.

FIG. 9 is a schematic diagram of a structure of a projection optical system according to the embodiment of the present invention.

In FIG. 9, like reference characters designate like functional portions common to the embodiments described above. The direction of gravity agrees with the optical axis and is indicated by −Z in the drawing.

FIG. 9 shows a supporting member 62 for coaxially supporting lens barrel units which are fixed with bolts to desired positions in the supporting member 62 by interposing the spacers 54 for adjusting the lens position in the optical axial direction therebetween.

In the first and second embodiments, the lens barrel units are fixed together via the spacers with bolts; in the embodiment, since each lens barrel unit is fixed to the supporting member 62 having high rigidity, the optical system can be assembled without the interaction between the lens barrel units to apply assembling strain to each other.

In the embodiment, just like in the first embodiment, the supporting member 51 is made from brass and the entire outer periphery of the lens 5 is filled with adhesive; however, of course, just like in the second embodiment, it may be possible that the thermal expansion coefficient of the supporting member is substantially equalized to that of the lens so as to reduce the amount of the adhesive.

(Seventh Embodiment)

Figure 10:
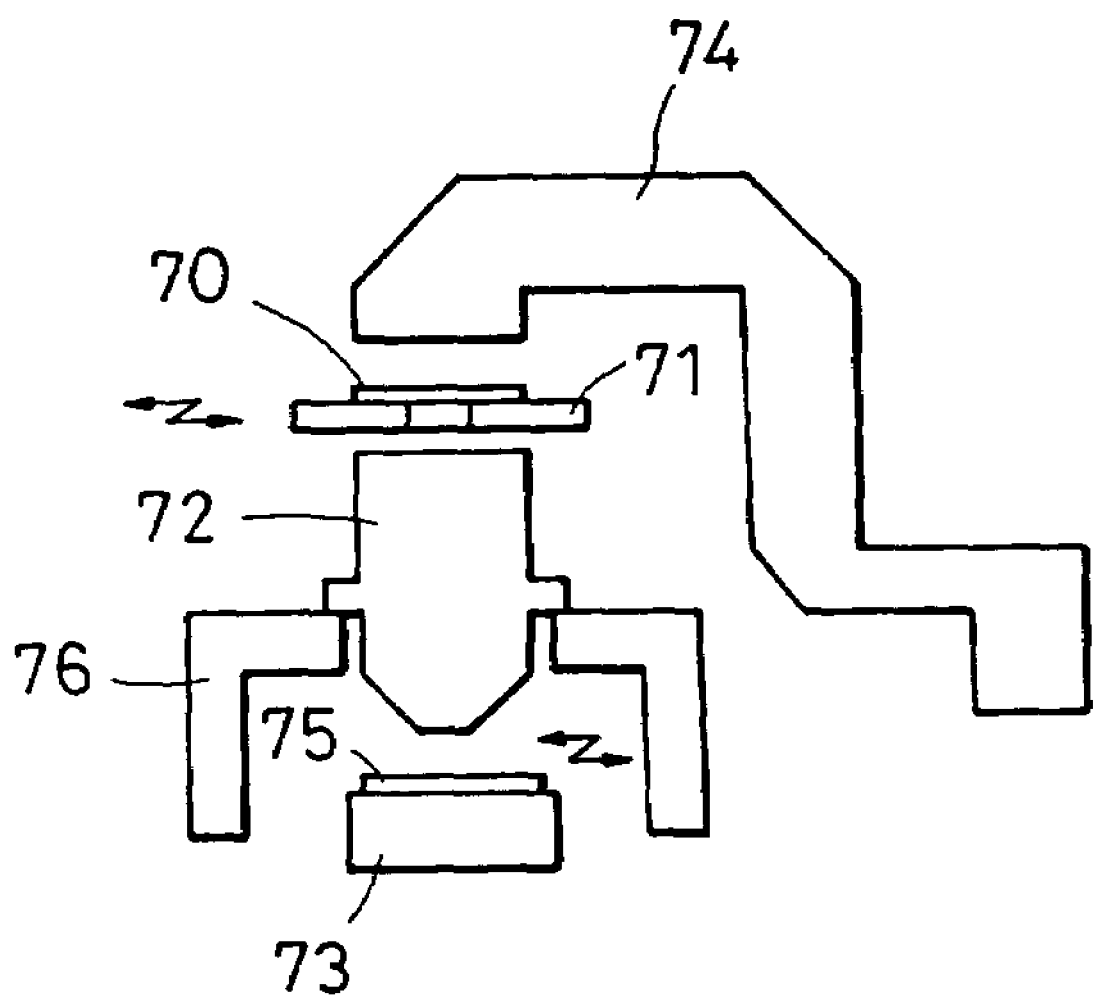
FIG. 10 is a schematic illustration of an exposure apparatus for semiconductors according to a seventh embodiment of the present invention.
Figure 11:
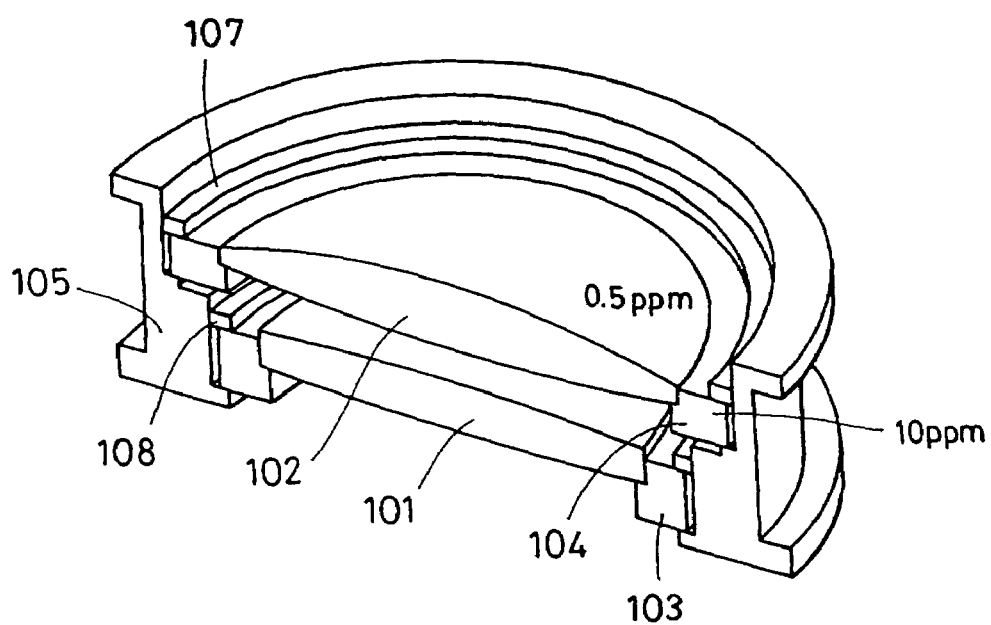
FIG. 11 is a drawing of a conventional lens holding member.

FIG. 10 is a schematic diagram of an exposure apparatus, in which the lens supporting structure shown in FIG. 5 is applied to a semiconductor exposure apparatus. In the exposure apparatus, part of a reticle 70 placed on a reticle stage 71 is irradiated with an illuminating light beam for exposure from an illuminating optical system 74. The illuminating light beam is an excimer laser beam having a wavelength of 193 nm. The irradiated region is slit-like and covering part of a pattern region of the reticle. The pattern corresponding to the slit-like portion is reduced in scale to be a quarter by a projection optical system 72 so as to be projected on a wafer 75 placed on a wafer stage 73. The projection optical system 72 is arranged on a frame 76 of the exposure apparatus. By scanning the reticle and the wafer relative to the projection optical system, the pattern region of the reticle is transferred on sensitive materials on the wafer. This scanning exposure is repeatedly performed on plural transfer regions (shots). The projection optical system 72 is required to have high resolution and the supporting member for the lens thereof is demanded to have a structure with high accuracies. Quartz and fluorite are used for the material of the lens. These lenses are supported as shown in FIG. 5, and in FIG. 5, when numeral 5 denotes a quartz lens, an alloy member 51 is an alloy including iron and nickel as principal ingredients such as invar; when the numeral 5 denotes a fluorite lens, it is preferable that an alloy member 51 be made of an alloy of copper and zinc as principal ingredients such as brass. A material of the supporting member for supporting the quartz lens may be preferably selected from a cordierite material including magnesium oxide and silicon oxide, a ceramic material including alumina and silicon nitride, and a glass material having low thermal expansion which is called Zerojule as the trade name.

A material of the member for supporting the fluorite lens may be preferably selected from an alloy of iron-chromium-nickel such as so-called 18-8 stainless steel, an alloy of copper-tin-phosphorus, which is called copper or phosphor bronze, an alloy of nickel-iron-manganese-copper, which is called copper or white copper, an alloy of nickel-chromium, and an alloy including aluminum as a principal ingredient such as an aluminum die-casing alloy of aluminum-silicon-copper.

As a material of the supporting member 53, a material having any thermal expansion coefficient from iron down may be used. By the elastic member 52, the unnecessary deformation of the lens due to the thermal expansion coefficient difference between materials being different from each other can be reduced. When the entire lens system is fixed to the frame 76 of the exposure apparatus body, the strain due to the fixing may be produced in the lens supporting member 53; however, the elastic member 52 has a function of reducing the strain from affecting the lens. Therefore, the lens supporting structure with high accuracies can be obtained, so that a lens system for obtaining resolution required for manufacturing semiconductors can be achieved.

In the above embodiment, the projection lens system of the semiconductor exposure apparatus has been described as an example; however, the invention may be applied to a mirror other than a lens as an optical element. Also, it may be applied to an optical element in which deformation is a problem such as an optical element to which diffraction is applied.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A supporting structure for supporting an optical element, said supporting structure comprising:
   a supported member including the optical element; and
   a supporting member for supporting said supported member via a plurality of elastic members, each of which comprises a spring member, having elasticity in a radial direction of the optical element.

2. A structure according to claim 1, wherein said spring member comprises a plate-shaped spring member.

3. A structure according to claim 1, wherein each of said plurality of elastic members is contacted with an outer surface of said supported member and an inner surface of said supporting member.

4. A structure according to claim 1, wherein said plurality of elastic members are disposed at intervals along a periphery of said supported member.

5. An exposure apparatus for exposing a wafer to light via a reticle, said apparatus comprising:
   an illuminating optical system for illuminating the reticle with light from a light source; and
   a projection optical system for projecting light from the reticle onto the wafer,
   wherein at least one of said illuminating optical system and said projection optical system comprises a supporting structure, as defined in claim 1, for supporting an optical element.

6. A method of manufacturing a semiconductor device, said method comprising steps of:
   providing a reticle and a wafer into an exposure apparatus as defined in claim 5; and
   exposing the wafer to light using the exposure apparatus.

* * * * *